US012593626B2

(12) United States Patent
Wei et al.

(10) Patent No.: US 12,593,626 B2
(45) Date of Patent: Mar. 31, 2026

(54) METHOD FOR PREPARING SILICON-ON-INSULATOR

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Xing Wei, Shanghai (CN); Ziwen Wang, Shanghai (CN); Rongwang Dai, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 532 days.

(21) Appl. No.: 18/138,696

(22) Filed: Apr. 24, 2023

(65) Prior Publication Data

US 2024/0153764 A1 May 9, 2024

(30) Foreign Application Priority Data

Nov. 4, 2022 (CN) .......................... 202211378498.6

(51) Int. Cl.
| | |
|---|---|
| *H01L 21/02* | (2006.01) |
| *H01L 21/304* | (2006.01) |
| *H01L 21/306* | (2006.01) |
| *H01L 21/3205* | (2006.01) |
| *H01L 21/321* | (2006.01) |

(Continued)

(52) U.S. Cl.
CPC .. *H01L 21/02532* (2013.01); *H01L 21/02381* (2013.01); *H01L 21/0242* (2013.01); *H01L 21/02422* (2013.01); *H01L 21/02428* (2013.01); *H01L 21/304* (2013.01); *H01L 21/30604* (2013.01); *H01L 21/32055* (2013.01); *H01L 21/32105* (2013.01); *H01L 21/32134* (2013.01);

(Continued)

(58) Field of Classification Search
CPC ......... H01L 21/30604; H01L 21/02428; H01L 21/32105; H01L 21/02013; H01L 21/02019
See application file for complete search history.

(56) References Cited

U.S. PATENT DOCUMENTS

| | | | |
|---|---|---|---|
| 2011/0140230 A1* | 6/2011 | Daval | H01L 21/76254 |
| | | | 257/E21.561 |
| 2023/0066574 A1* | 3/2023 | Cheng | H01L 21/76289 |

* cited by examiner

*Primary Examiner* — Davienne N Monbleau
*Assistant Examiner* — Megan Parrish
(74) *Attorney, Agent, or Firm* — IPRTOP LLC

(57) ABSTRACT

In a method for preparing silicon-on-insulator, the first etching stop layer, the second etching stop layer, and the device layer are formed bottom-up on the p-type monocrystalline silicon epitaxial substrate, where the first etching stop layer is made of intrinsic silicon, the second etching stop layer is made of germanium-silicon alloy, and the device layer is made of silicon. After oxidation, bonding, reinforcement, and grinding treatment, selective etching is performed. Through a first selective etching to p+/intrinsic silicon, the thickness deviation of the first etching stop layer on the second etching layer is controlled within 100 nm, and then through the second etching and the third etching, the thickness deviation and the surface roughness of the finally prepared silicon-on-insulator film can be optimized to less than 5 nm and less than 4 Å, respectively, so as to realize the flatness of the silicon-on-insulator film.

11 Claims, 4 Drawing Sheets

(51) Int. Cl.
    *H01L 21/3213*          (2006.01)
    *H01L 21/324*           (2006.01)
(52) U.S. Cl.
    CPC .. *H01L 21/02013* (2013.01); *H01L 21/02019*
                 (2013.01); *H01L 21/324* (2013.01)

| |
|---|
| providing an epitaxial substrate and a supporting substrate, where the epitaxial substrate is a p-type monocrystalline silicon epitaxial substrate |

S1

| |
|---|
| forming a first etching stop layer, a second etching stop layer, and a device layer from bottom to top on the epitaxial substrate by an epitaxial method, where the first etching stop layer is an intrinsic silicon layer, the second etching stop layer is a germanium-silicon alloy layer, and the device layer is a silicon device layer |

S2

| |
|---|
| forming an insulating layer, and bonding the device layer to the supporting substrate through the insulating layer |

S3

| |
|---|
| grinding the epitaxial substrate and keeping a part of the epitaxial substrate in reserve |

S4

| |
|---|
| performing a first etching by using a first etching solution to remove a remaining epitaxial substrate |

S5

| |
|---|
| performing a second etching by using a second etching solution to remove the first etching stop layer |

S6

| |
|---|
| performing a third etching by using a third etching solution to remove the second etching stop layer and forming a silicon-on-insulator structure |

S7

| |
|---|
| subjecting the silicon-on-insulator structure to a sacrificial oxidation treatment to remove a part of the device layer, and performing a thermal treatment to obtain a silicon-on-insulator film |

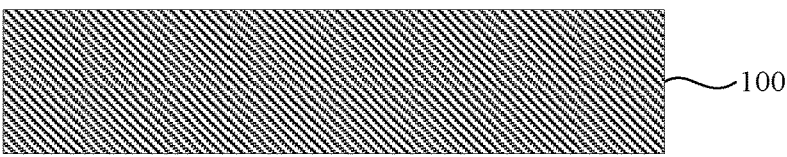

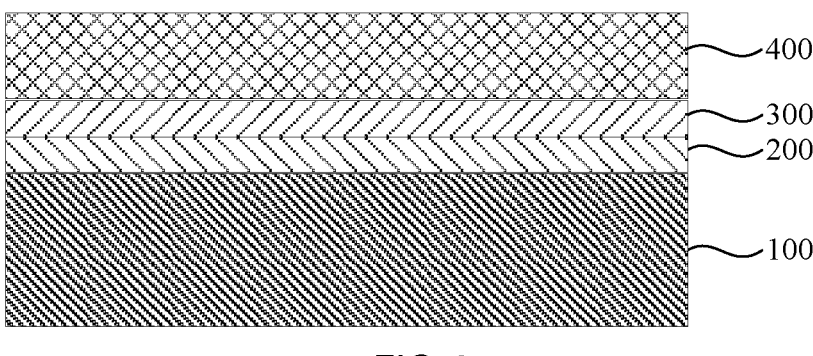
FIG. 3
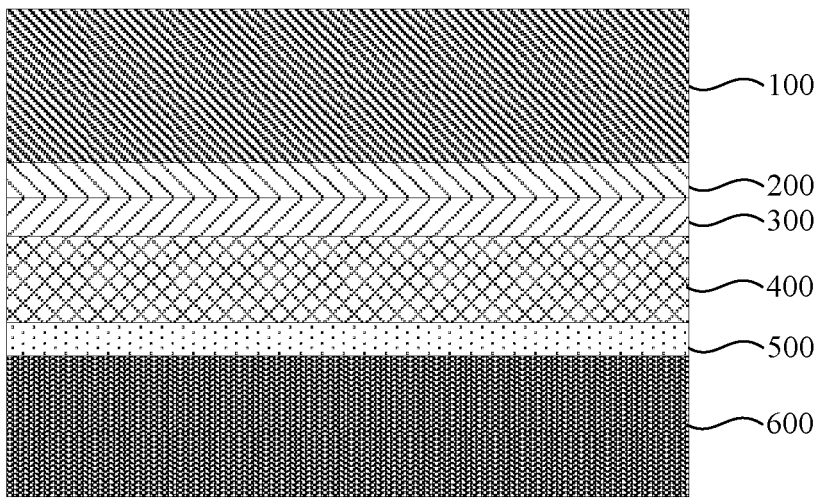
FIG. 4
FIG. 5

410

500

600

METHOD FOR PREPARING SILICON-ON-INSULATOR

FIELD OF TECHNOLOGY

The present disclosure relates to the field of semiconductors, in particular to a method for preparing silicon-on-insulator.

BACKGROUND

With the continuous development of integrated circuits, the feature size of electronic components is shrinking. Fin Field-Effect Transistor (FinFET) technology and silicon-on-insulator (SOI) technology are the two mainstream routes at the present.

The demand for SOI substrate materials is increasing day by day along with the development of SOI technology. SOI is typically composed of a supporting substrate, an insulating layer, and a device layer. Nowadays, the preparation methods of SOI mainly include Bonding and Etch-back SOI (BESOT) technology, Separation by Implantation of Oxygen (SIMOX) technology, and Smartcut™ technology.

Specifically, the principle of BESOT is to effectively improve the thickness uniformity of silicon-on-insulator through the different etch selectivities of etching solution towards an etching stop layer and a device layer. Since the thickness uniformity before etching and the etch selectivity have a great impact on the thickness uniformity after etching, it is necessary to strictly control the thickness uniformity before etching. In the prior art, mechanical grinding and further chemical-mechanical polishing are generally employed to control the thickness deviation of the etching stop layer to about 0.2 μm, however, the 0.2 μm thickness deviation is still large. Therefore, it is difficult to meet the requirements of a flattened silicon-on-insulator considering the difficulty of decreasing the thickness deviation.

SUMMARY

The present disclosure provides a method for preparing silicon-on-insulator, which achieves a thickness uniformity of silicon-on-insulator.

The method for preparing silicon-on-insulator includes:

providing an epitaxial substrate and a supporting substrate, where the epitaxial substrate is a p-type monocrystalline silicon epitaxial substrate;

forming a first etching stop layer, a second etching stop layer, and a device layer from bottom to top on the epitaxial substrate by an epitaxial method, where the first etching stop layer is an intrinsic silicon layer, the second etching stop layer is a germanium-silicon alloy layer, and the device layer is a silicon device layer;

forming an insulating layer, and bonding the device layer to the supporting substrate through the insulating layer;

grinding the epitaxial substrate and keeping a part of the epitaxial substrate in reserve;

performing a first etching by using a first etching solution to remove a remaining epitaxial substrate;

performing a second etching by using a second etching solution to remove the first etching stop layer;

performing a third etching by using a third etching solution to remove the second etching stop layer and forming a silicon-on-insulator structure;

subjecting the silicon-on-insulator structure to a sacrificial oxidation treatment to remove a part of the device layer, and performing a thermal treatment to obtain a silicon-on-insulator film.

In an embodiment, the epitaxial substrate includes a heavily doped p-type monocrystalline silicon epitaxial substrate, the supporting substrate includes one of a silicon supporting substrate, a sapphire supporting substrate, a quartz supporting substrate, and a glass supporting substrate, and the device layer includes a doped silicon device layer.

In an embodiment, when forming the first etching stop layer by the epitaxial method, an epitaxial temperature of forming the first etching stop layer is not greater than 1200° C., and an epitaxial thickness of the formed first etching stop layer is not greater than 1000 nm; when forming the second etching stop layer by the epitaxial method, an epitaxial temperature of forming the second etching stop layer is not greater than 800° C., and an epitaxial thickness of the formed second etching stop layer is in a range of 10 nm-60 nm. The formed second etching stop layer is a $Ge_xSi_y$ layer, where x is in a range of 0.1-0.5, and y is in a range of 1-x. When forming the device layer by the epitaxial method, an epitaxial temperature of forming the device layer is less than 800° C., and an epitaxial thickness of the formed device layer is not greater than 600 nm.

In an embodiment, the insulating layer is formed on a surface of the device layer or the supporting substrate, or a combination thereof.

In an embodiment, the bonding of the device layer to the supporting substrate includes a surface oxygen plasma treatment and a reinforcement treatment.

In an embodiment, a method for grinding the epitaxial substrate includes one or a combination of mechanical grinding and chemical mechanical grinding, the thickness of the epitaxial substrate kept in reserve is not greater than 2 μm, and the thickness deviation of the epitaxial substrate is less than 0.5 μm.

In an embodiment, the first etching solution includes a mixed solution of HF, $HNO_3$, and Hac, the second etching solution includes TMAH, and the third etching solution includes a mixed solution of HF, $HNO_3$, and Hac or a mixed solution of HF, $H_2O_2$, and Hac.

In an embodiment, the sacrificial oxidation treatment includes one or a combination of dry oxygen and wet oxygen, in which an oxidation temperature is 700° C. to 1100° C., and an oxide layer on a surface of the silicon-on-insulator structure is removed by using an HF solution after the oxidation treatment.

In an embodiment, the thermal treatment includes a rapid thermal anneal, a long-time thermal anneal, or an alternation of both, where a temperature of the rapid thermal anneal ranges from 1150° C. to 1300° C., a temperature of the long-time thermal anneal ranges from 1050° C. to 1250° C., and an atmosphere of the thermal treatment includes a hydrogen-argon mixed atmosphere or a pure argon atmosphere.

In an embodiment, after subjecting the silicon-on-insulator structure to the sacrificial oxidation treatment and the thermal treatment, a thickness deviation of the obtained silicon-on-insulator film is less than 5 nm, and a surface roughness of the obtained silicon-on-insulator film is less than 4 Å.

In an embodiment, the method for preparing silicon-on-insulator further includes performing oxidative thinning or epitaxial growth on the silicon-on-insulator film to adjust the thickness of the silicon-on-insulator film.

As mentioned above, in the method for preparing silicon-on-insulator in the present disclosure, the first etching stop layer, the second etching stop layer, and the device layer are formed bottom-up on the p-type monocrystalline silicon epitaxial substrate, where the first etching stop layer is made of intrinsic silicon, the second etching stop layer is made of germanium-silicon alloy, and the device layer is made of silicon. After oxidation, bonding, reinforcement, and grinding treatment, selective etching is performed. Through a first selective etching to p+/intrinsic silicon, the thickness deviation of the first etching stop layer on the second etching layer is controlled within 100 nm, and then through the second etching and the third etching, the thickness deviation and the surface roughness of the finally prepared silicon-on-insulator film can be optimized to be less than 5 nm and less than 4 Å, respectively, so as to realize the flatness of the silicon-on-insulator film.

BRIEF DESCRIPTION OF THE DRAWINGS

FIG. 1 shows a process flow diagram of forming a silicon-on-insulator according to an embodiment of the present disclosure.

FIG. 2 shows a schematic diagram of forming an epitaxial layer according to an embodiment of the present disclosure.

FIG. 3 shows a schematic diagram of forming a first etching stop layer, a second etching stop layer, and a device layer on the epitaxial layer according to an embodiment of the present disclosure.

FIG. 4 shows a schematic diagram of forming an insulating layer according to an embodiment of the present disclosure.

FIG. 5 shows a schematic diagram of bonding a device layer to a supporting substrate according to an embodiment of the present disclosure.

REFERENCE NUMERALS

Figure 6:
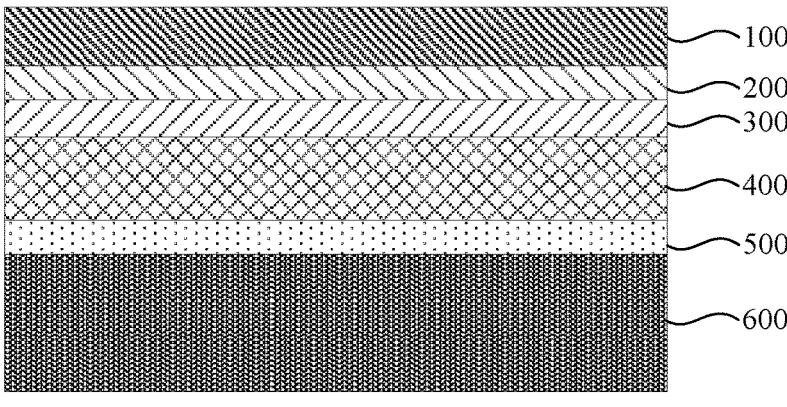
FIG. 6 shows a schematic diagram of grinding the epitaxial layer according to an embodiment of the present disclosure.

100 Epitaxial substrate
200 First etching stop layer
300 Second etching stop layer
400 Device layer
410 Silicon-on-insulator film
500 Insulating layer
600 Supporting substrate

DETAILED DESCRIPTION

The embodiments of the present disclosure will be described below through specific examples. Those skilled in the art can easily understand other advantages and effects of the present disclosure according to the contents disclosed by the specification. The present disclosure may also be implemented or applied through other different specific implementation modes. Various modifications or changes may be made to all details in the specification based on different points of view and applications without departing from the spirit of the present disclosure.

When describing the embodiments of the present disclosure, the cross-sectional view showing the structure of the device will not be partially enlarged to the general scale for convenience of description, and the schematic diagrams are only examples, which should not be regarded as limitations to the protection scope of the present disclosure. In addition, three-dimensional spatial dimensions of length, width, and depth should be included in the actual production.

For ease of description, spatial words such as "below", "under", "lower", "beneath", "on", "above", and the like may be used herein to describe the relationship of one shown element or feature to other elements or features in the drawings. It should be understood that these spatial relationship words are intended to include other directions of the device in use or in operation, in addition to the directions depicted in the drawings. Further, when a layer is referred to as being "between" two layers, it may be the only layer between the two layers, or there may be one or more layers between the two layers.

In the context of the present disclosure, the described structure of the first feature being "above" the second feature may include embodiments in which the first and second features are in direct contact, and may also include embodiments in which additional features are formed between the first and second features, such that the first and second features may not be in direct contact.

It needs to be stated that the drawings provided in the following embodiments are just used for schematically describing the basic concept of the present disclosure, thus only illustrating components related to the present disclosure and are not drawn according to the numbers, shapes, and sizes of components during actual implementation, the configuration, number, and scale of each component during the actual implementation thereof may be freely changed, and the component layout configuration thereof may be more complicated.

As shown in FIG. 1, the present disclosure provides a method for preparing silicon-on-insulator. The method includes:

S1: providing an epitaxial substrate and a supporting substrate, where the epitaxial substrate is a p-type monocrystalline silicon epitaxial substrate;

S2: forming a first etching stop layer, a second etching stop layer, and a device layer from bottom to top on the epitaxial substrate by an epitaxial method, where the first etching stop layer is an intrinsic silicon layer, the second etching stop layer is a germanium-silicon alloy layer, and the device layer is a silicon device layer;

S3: forming an insulating layer, and bonding the device layer to the supporting substrate through the insulating layer;

S4: grinding the epitaxial substrate and keeping a part of the epitaxial substrate in reserve;

S5: performing a first etching by using a first etching solution to remove a remaining epitaxial substrate;

S6: performing a second etching by using a second etching solution to remove the first etching stop layer;

S7: performing a third etching by using a third etching solution to remove the second etching stop layer and forming a silicon-on-insulator structure;

S8: subjecting the silicon-on-insulator structure to a sacrificial oxidation treatment to remove a part of the device layer, and performing a thermal treatment to obtain a silicon-on-insulator film.

In this embodiment, the first etching stop layer, the second etching stop layer, and the device layer are formed bottom-up on the p-type monocrystalline silicon epitaxial substrate, where the first etching stop layer is made of intrinsic silicon, the second etching stop layer is made of germanium-silicon alloy, and the device layer is made of silicon. After oxidation, bonding, reinforcement, and grinding treatment, selective etching is performed. Through a first selective etching to p+/intrinsic silicon, the thickness deviation of the first etching stop layer on the second etching layer is controlled within 100 nm, and then through the second etching and the third etching, the thickness deviation and the surface roughness of the finally prepared silicon-on-insulator film can be optimized to less than 5 nm and less than 4 Å, respectively, so as to realize the flatness of the silicon-on-insulator film.

The method for preparing silicon-on-insulator is further described according to FIGS. 2-10.

As shown in FIGS. 2 and 5, step S1 is performed to provide an epitaxial substrate 100 and a supporting substrate 600.

In an embodiment, the epitaxial substrate 100 may include a heavily doped p-type (p+) monocrystalline silicon epitaxial substrate, the supporting substrate 600 may include one of a silicon supporting substrate, a sapphire supporting substrate, a quartz supporting substrate, and a glass supporting substrate.

Specifically, in this embodiment, the epitaxial substrate 100 is a heavily boron-doped p-type monocrystalline silicon having a resistivity of less than 0.1 Ω·m, but the type of the epitaxial substrate 100 is not limited thereto. The supporting substrate 600 mainly plays a role of supporting, and the material can be selected in a relatively wide range, therefore, no restriction is made here. And both the epitaxial substrate 100 and the supporting substrate 600 can be flexibly selected as required.

As shown in FIG. 3, step S2 is performed to form a first etching stop layer 200, a second etching stop layer 300, and a device layer 400 from bottom to top on the epitaxial substrate 100 by an epitaxial method, where the first etching stop layer 200 is an intrinsic silicon layer, the second etching stop layer 300 is a germanium-silicon alloy layer, and the device layer 400 is a silicon device layer.

As an example, when epitaxially forming the first etching stop layer 200, an epitaxial temperature of forming the first etching stop layer 200 is not greater than 1200° C., and an epitaxial thickness of the first etching stop layer 200 is not greater than 1000 nm; when epitaxially forming the second etching stop layer 300, an epitaxial temperature of forming the second etching stop layer 300 is not greater than 800° C., and an epitaxial thickness of the formed second etching stop layer 300 ranges from 10 nm to 60 nm. The formed second etching stop layer 300 is a $Ge_xSi_y$ layer, where the value of x ranges from 0.1 to 0.5, and the value of y ranges from 1 to x. When epitaxially forming the device layer 400, an epitaxial thickness of the device layer 400 is not greater than 600 nm, and an epitaxial temperature of forming the device layer 400 is less than 800° C.

Specifically, since the diffusion coefficient of germanium in the germanium-silicon alloy is extremely low under high temperature conditions, it is not easy to destroy the clear interface of the etching stop layer/device layer during the thermal treatment process such as thermal oxidation, and an effective stop of selective etching can be realized. In addition, germanium atoms will not significantly affect the electrical characteristics of silicon, so that the second etching stop layer 300 in contact with the device layer 400 is preferably made of germanium-silicon alloy. Further, to prevent the thermal diffusion of impurity atoms in the etching stop layer, the thermal budget needs to be strictly controlled. When the second etching stop layer 300 is made of germanium-silicon alloy, the etching selectivity is closely related to the germanium content in the germanium-silicon alloy, and the greater the germanium content, the higher the etching selectivity. However, on the other hand, a large germanium content leads to a relaxation of the germanium-silicon alloy, and it is easy to introduce additional defects to the device layer 400. Therefore, a trade-off is needed between the above two aspects.

In this embodiment, the first etching stop layer 200 is an intrinsic silicon layer with a resistivity no less than 10 Ω·m, the epitaxial thickness of the first etching stop layer 200 is not greater than 1000 nm, such as 500 nm, 800 nm, 1000 nm, etc., the epitaxial temperature of forming the first etching stop layer 200 is not greater than 1200° C., for example, the epitaxial temperature may be 800° C., 1000° C., 1200° C., etc., where the epitaxial process can be normal pressure epitaxy or reduced pressure epitaxy, and an epitaxial precursor can be DCS or TCS.

The second etching stop layer 300 is a germanium-silicon alloy $Ge_xSi_y$, where the germanium content may be 0.1, 0.2, 0.25, 0.4, 0.5, etc., the thickness of the second etching stop layer 300 may range from 10 nm to 60 nm, such as 10 nm, 20 nm, 30 nm, 50 nm, 60 nm, etc., and the epitaxial temperature of forming the second etching stop layer 300 is not greater than 800° C., for example, the epitaxial temperature may be 600° C., 700° C., 800° C., and the like. In an embodiment, the second etching stop layer 300 has a thickness ranging from 30 nm to 50 nm, the germanium content x of the second etching stop layer 300 is in a range of 0.2 to 0.3, the epitaxial process may be a reduced pressure epitaxy, and the epitaxial precursors of silicon and germanium may be DCS and $GeH_4$, respectively.

The device layer 400 epitaxially formed on the second etching stop layer 300 can be a doped silicon device layer with one layer, and the doping concentration of the device layer 400 depends on the specific requirements of the subsequently formed silicon-on-insulator film 410. In order to ensure the thickness uniformity of the silicon-on-insulator film 410, the epitaxial thickness of the device layer 400 is not greater than 600 nm, for example, the epitaxial thickness may be 400 nm, 500 nm, 600 nm, etc., the epitaxial temperature of forming the device layer 400 is less than 800° C., for example, the epitaxial temperature may be 700° C., 600° C., 500° C., etc., the epitaxial process can be a reduced pressure epitaxy, and the epitaxial precursor can be DCS.

The thickness and preparation method of the first etching stop layer 200, the second etching stop layer 300, and the device layer 400 are not excessively limited herein.

As shown in FIGS. 4-5, step S3 is performed to form an insulating layer 500, where the device layer 400 and the supporting substrate 600 are bonded through the insulating layer 500.

In an embodiment, the insulating layer 500 is formed on a surface of the device layer 400 or the supporting substrate 600, or formed on surfaces of the device layer 400 and the supporting substrate 600.

In this embodiment, the insulating layer 500 is formed on the surface of the device layer 400, and the device layer 400 is oxidized to form a silicon oxide insulating layer on the surface of the device layer 400, where the silicon oxide insulating layer finally serves as the insulating layer of the silicon-on-insulator structure. In order to prevent the thermal diffusion of doping atoms, the oxidation temperature is not greater than 850° C., preferably not greater than 800° C., for example, the oxidation temperature may be 800° C., 600° C., etc., the oxidation time may be selected according to the thickness requirement of the finally formed insulating layer 500, and the oxidation temperature and the oxidation time are not particularly limited herein. The method for forming the insulating layer 500 is not limited thereto. The insulating layer 500 may also be formed on the surface of the supporting substrate 600 or on the surfaces of the device layer 400 and the supporting substrate 600 as needed, and no limitation is set herein.

In an embodiment, the bonding of the device layer 400 to the supporting substrate 600 through the insulating layer 500 includes a surface oxygen plasma treatment and a reinforcement treatment.

Specifically, the surfaces of the insulating layer 500 and the supporting substrate 600 to which are to be bonded can each be treated with oxygen plasma to increase the bonding strength at the room temperature and then with low-temperature reinforcement treatment, where the temperature of the reinforcement treatment is not greater than 700° C., for example, the temperature may be 700° C., 500° C., and 400° C., preferably 300° C. to 500° C., and the time of the reinforcement treatment is not greater than 4 hours, for example, the time of the reinforcement treatment may be 4 hours, 3 hours, and 2 hours.

As shown in FIG. 6, step S4 is performed to grind the epitaxial substrate 100 and then keep a part of the epitaxial substrate 100 in reserve.

In an embodiment, a method for grinding the epitaxial substrate 100 includes one or a combination of mechanical grinding and chemical mechanical grinding, where the thickness of the epitaxial substrate kept in reserve is not greater than 2 μm, for example, the thickness may be 2 μm, 1 μm, etc., and the thickness deviation of the epitaxial substrate after grinding is less than 0.5 μm, for example, the thickness deviation may be 0.5 μm, 0.4 μm, 0.2 μm, etc.

Figure 7:
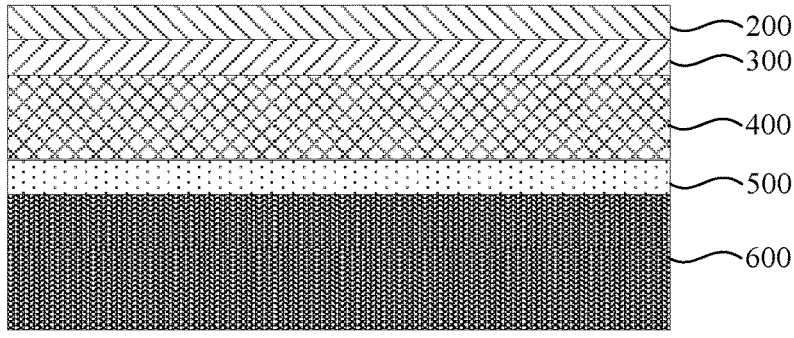
FIG. 7 shows a schematic diagram of performing a first etching to remove the epitaxial layer according to an embodiment of the present disclosure.

As shown in FIG. 7, step S5 is performed to implement a first etching by using a first etching solution to remove the remaining epitaxial substrate 100.

Figure 10:
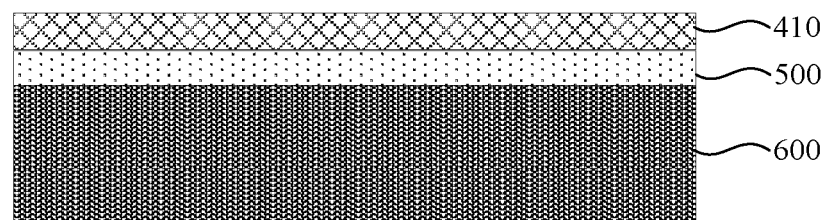
FIG. 10 shows a schematic diagram of performing a sacrificial oxidation treatment and a thermal treatment on the silicon-on-insulator structure according to an embodiment of the present disclosure.

Specifically, when removing the remaining epitaxial substrate 100, the first etching solution having a certain etching selectivity is employed to etch the remaining epitaxial substrate 100 for the first time, where the first etching solution etches p+ type silicon material, such as boron-doped p+ silicon material, at a high speed, while etching the intrinsic silicon material at a low speed. Therefore, the first etching reaction stops at the interface of p+/first etching stop layer, that is, the first etching reaction stops at the interface of the epitaxial substrate 100 and the first etching stop layer 200, and the thickness deviation of the first etching stop layer 200 made of intrinsic silicon material is controlled within 100 nm, where the first etching stop layer 200 made of intrinsic silicon material is located on the second etching stop layer 300 made of germanium-silicon alloy layer. As a result, the thickness deviation of the first etching stop layer (i.e., 100 nm) in the present disclosure is beyond the reach of mechanical chemical polishing, which is beneficial to optimize the thickness deviation of the silicon-on-insulator film 410 prepared as shown in FIG. 10 to be less than 5 nm after the second etching and the third etching, so as to realize the flatness of the silicon-on-insulator film 410. The first etching solution may be a mixed solution of HF, HNO₃, and Hac. The corresponding etching selectivity varies with the concentration of the first etching solution, and those skilled in the art may adjust the etching selectivity as needed.

Figure 8:
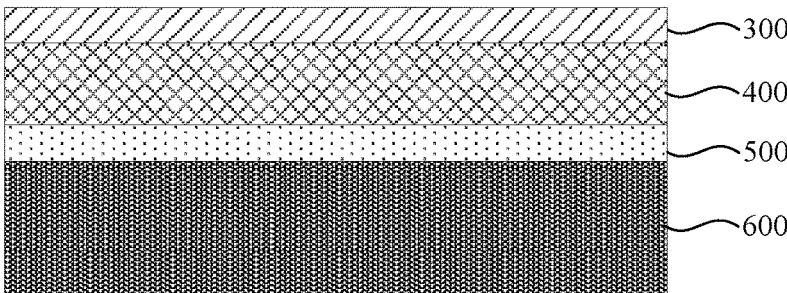
FIG. 8 shows a schematic diagram of performing a second etching to remove the first etching stop layer according to an embodiment of the present disclosure.

As shown in FIG. 8, step S6 is performed to implement a second etching by using a second etching solution to remove the first etching stop layer 200.

Specifically, the second etching may be performed by using a stress-sensitive etchant to remove the first etching stop layer 200, and the second etching solution may be tetramethylammonium hydroxide (TMAH) having a concentration no greater than 25%, such as 25%, 20%, 15%, etc. The etching temperature of the second etching may range from 50° C. to 90° C., such as 50° C., 60° C., 80° C., 90° C., etc., preferably, range from 55° C. to 70° C., and the second etching reaction stops at the interface of the intrinsic silicon/silicon-germanium alloy layer, that is, the second etching reaction stops at the interface between the first etching stop layer 200 and the second etching stop layer 300.

Figure 9:
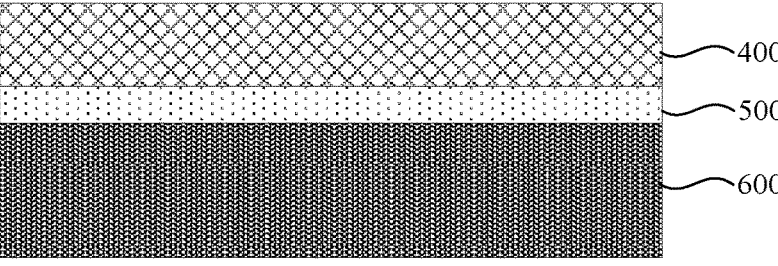
FIG. 9 shows a schematic diagram of performing a third etching to remove the second etching stop layer and form a silicon-on-insulator structure according to an embodiment of the present disclosure.

As shown in FIG. 9, step S7 is performed to implement a third etching by using a third etching solution to remove the second etching stop layer 200 and then form a silicon-on-insulator structure.

Specifically, an etching solution with a high etching selectivity for the second etching stop layer 300 and the device layer 400 may serve as the third etching solution to perform the third etching. For example, the third etching solution may include a mixed solution of HF, HNO₃, and Hac, or a mixed solution of HF, H₂O₂, and Hac, to perform the third etching. The second etching stop layer 300 made of germanium-silicon alloy layer may be removed, and the third etching reaction stops at the interface of the germanium-silicon alloy layer/the device layer, so that the silicon-on-insulator structure is finally obtained. The corresponding etching selectivity varies with the concentrations of the third etching solution, those skilled in the art may adjust the etching selectivity to meet specific requirements.

As shown in FIG. 10, step S8 is performed to subject the silicon-on-insulator structure to a sacrificial oxidation process to remove a portion of the device layer 400 and then to a thermal treatment to obtain a silicon-on-insulator film 410.

Specifically, after the third etching, the surface of the device layer 400 will form a layer of porous film (Si/SiO$_x$) having a diameter of tens of nanometers. To remove the porous film and to further strengthen the bonding interface, the silicon-on-insulator structure obtained after etching is subjected to the sacrificial oxidation treatment, where the sacrificial oxidation may include dry oxygen, wet oxygen, or a combination thereof, and the oxidation temperature ranges from 700° C. to 1100° C., such as 700° C., 800° C., 1100° C. It is preferably in an atmosphere at 750° C.-1000° C. to perform the sacrificial oxidation treatment to remove 50 nm-200 nm thickness of the device layer, such as 50 nm, 100 nm, 150 nm, 200 nm, etc. The specific oxidation time may be determined according to the target thickness and the oxidation temperature, therefore, the oxidation time is not excessively limited herein. After the above oxidation, a formed oxide layer on the surface is removed by using an HF solution, where the concentration of HF is less than 20%, for example, the concentration may be 15%, 10%, 5%, etc., and preferably 5%.

After removing the porous film, a final treatment is performed to optimize the surface roughness, where the final treatment may be a rapid thermal anneal (RTA), a long-time thermal anneal (batch anneal), or a combination thereof that performs alternately. The atmosphere of the thermal treatment may be a hydrogen-argon mixed atmosphere or a pure argon atmosphere, the temperature of the rapid thermal anneal ranges from 1150° C. to 1300° C., and the temperature of the long-time thermal anneal ranges from 1050° C. to 1250° C., thus, the silicon-on-insulator film 410, which is with good flatness, having a thickness deviation of less than 5 nm, such as 4 nm, 3 nm, 2 nm, etc., and a surface roughness of less than 4 Å, such as 4 Å, 2 Å, 1 Å, etc., is obtained.

Further, when adjusting the thickness of the finally formed silicon-on-insulator film 410, the method for preparing silicon-on-insulator may further include performing an oxidation thinning process or an epitaxial process on the silicon-on-insulator film 410, so that the thickness of the finally formed silicon-on-insulator film 410 may meet a specific requirement that can be adjusted as needed.

In summary, in the method for preparing silicon-on-insulator of the present disclosure, the first etching stop layer, the second etching stop layer, and the device layer are formed bottom-up on the p-type monocrystalline silicon epitaxial substrate, where the first etching stop layer is made of intrinsic silicon, the second etching stop layer is made of germanium-silicon alloy, and the device layer is made of silicon. After oxidation, bonding, reinforcement, and grinding treatment, selective etching is performed. Through a first selective etching to p+/intrinsic silicon, the thickness deviation of the first etching stop layer on the second etching layer is controlled within 100 nm, and then through the second etching and the third etching, the thickness deviation and the surface roughness of the finally prepared silicon-on-insulator film can be optimized to less than 5 nm and less than 4 Å, respectively, so as to realize the flatness of the silicon-on-insulator film.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those skilled in the art without departing from the spirit and scope of the disclosure will be covered by the appended claims.

What is claimed is:

1. A method for preparing silicon-on-insulator, comprising:
    providing an epitaxial substrate and a supporting substrate, wherein the epitaxial substrate is a p-type monocrystalline silicon epitaxial substrate;
    forming a first etching stop layer, a second etching stop layer, and a device layer from bottom to top on the epitaxial substrate by an epitaxial method, wherein the first etching stop layer is an intrinsic silicon layer, the second etching stop layer is a germanium-silicon alloy layer, and the device layer is a silicon device layer;
    forming an insulating layer, and bonding the device layer to the supporting substrate through the insulating layer;
    grinding the epitaxial substrate and keeping a part of the epitaxial substrate in reserve;
    performing a first etching by using a first etching solution to remove a remaining epitaxial substrate;
    performing a second etching by using a second etching solution to remove the first etching stop layer;
    performing a third etching by using a third etching solution to remove the second etching stop layer and forming a silicon-on-insulator structure;

subjecting the silicon-on-insulator structure to a sacrificial oxidation treatment to remove a part of the device layer, and performing a thermal treatment to obtain a silicon-on-insulator film.

2. The method for preparing silicon-on-insulator according to claim 1, wherein the epitaxial substrate comprises a heavily doped p-type monocrystalline silicon epitaxial substrate; the supporting substrate comprises one of a silicon supporting substrate, a sapphire supporting substrate, a quartz supporting substrate, and a glass supporting substrate; wherein the device layer comprises a doped silicon device layer.

3. The method for preparing silicon-on-insulator according to claim 1, wherein when epitaxially forming the first etching stop layer, an epitaxial temperature of forming the first etching stop layer is not greater than 1200° C., and an epitaxial thickness of the first etching stop layer is not greater than 1000 nm; wherein when epitaxially forming the second etching stop layer, an epitaxial temperature of forming the second etching stop layer is not greater than 800° C., and an epitaxial thickness of the second etching stop layer ranges from 10 nm to 60 nm, wherein the second etching stop layer is a $Ge_xSi_y$ layer, wherein x ranges from 0.1 to 0.5, and y ranges from 1 to x; wherein when epitaxially forming the device layer, an epitaxial temperature of forming the device layer is less than 800° C., and an epitaxial thickness of the device layer is not greater than 600 nm.

4. The method for preparing silicon-on-insulator according to claim 1, wherein the insulating layer is formed on a surface of the device layer or the supporting substrate, or formed on surfaces of the device layer and the supporting substrate.

5. The method for preparing silicon-on-insulator according to claim 1, wherein the bonding of the device layer to the supporting substrate through the insulating layer comprises a surface oxygen plasma treatment and a reinforcement treatment.

6. The method for preparing silicon-on-insulator according to claim 1, wherein the grinding of the epitaxial substrate comprises one or a combination of mechanical grinding and chemical-mechanical polishing, wherein a thickness of the epitaxial substrate kept in reserve is not greater than 2 μm, wherein a thickness deviation of the epitaxial substrate is less than 0.5 μm.

7. The method for preparing silicon-on-insulator according to claim 1, wherein the first etching solution comprises a mixed solution of HF, $HNO_3$, and Hac; wherein the second etching solution comprises TMAH; wherein the third etching solution comprises a mixed solution of HF, $HNO_3$, and Hac or a mixed solution of HF, $H_2O_2$, and Hac.

8. The method for preparing silicon-on-insulator according to claim 1, wherein the subjecting of the silicon-on-insulator structure to the sacrificial oxidation treatment comprises one or a combination of dry oxygen and wet oxygen, wherein an oxidation temperature ranges from 700° C. to 1100° C., and an HF solution is used to remove an oxide layer on a surface of the silicon-on-insulator structure after the sacrificial oxidation treatment.

9. The method for preparing silicon-on-insulator according to claim 1, wherein the thermal treatment comprises a rapid thermal anneal, a long-time thermal anneal, or a combination thereof that performs alternately; wherein a temperature of the rapid thermal anneal ranges from 1150° C. to 1300° C.; a temperature of the long-time thermal anneal ranges from 1050° C. to 1250° C.; and an atmosphere of the thermal treatment comprises a hydrogen-argon mixed atmosphere or a pure argon atmosphere.

10. The method for preparing silicon-on-insulator according to claim 1, wherein a thickness deviation of the silicon-on-insulator film is less than 5 nm and a surface roughness of the silicon-on-insulator film is less than 4 Å after the sacrificial oxidation treatment and the thermal treatment.

11. The method for preparing silicon-on-insulator according to claim 1, further comprising: performing oxidation thinning or epitaxial growth on the silicon-on-insulator film to adjust a thickness of the silicon-on-insulator film.

* * * * *